US011189710B2

(12) United States Patent
Lee et al.

(10) Patent No.: US 11,189,710 B2
(45) Date of Patent: Nov. 30, 2021

(54) METHOD OF FORMING A BOTTOM ISOLATION DIELECTRIC BY DIRECTIONAL SPUTTERING OF A CAPPING LAYER OVER A PAIR OF STACKS

(71) Applicant: Applied Materials, Inc., Santa Clara, CA (US)

(72) Inventors: Byeong Chan Lee, Pleasanton, CA (US); Tejinder Singh, San Jose, CA (US); Bencherki Mebarki, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/874,889

(22) Filed: May 15, 2020

(65) Prior Publication Data
US 2020/0373411 A1   Nov. 26, 2020

Related U.S. Application Data

(60) Provisional application No. 62/850,489, filed on May 20, 2019.

(51) Int. Cl.
*H01L 29/66* (2006.01)
*H01L 21/762* (2006.01)
(Continued)

(52) U.S. Cl.
CPC .... *H01L 29/66545* (2013.01); *H01L 21/0217* (2013.01); *H01L 21/02266* (2013.01);
(Continued)

(58) Field of Classification Search
CPC ......... H01L 29/78696; H01L 29/42392; H01L 29/0673; H01L 29/66439; H01L 29/775; H01L 21/76224–76235; H01L 21/76202–7621; H01L 21/823481; H01L 21/823878; H01L 29/0649–0653; H01L 21/308–3088; H01L 21/32; H01L 21/31144; H01L 21/467; H01L 21/475; H01L 29/66553; H01L 29/6653; H01L 29/66545; H01L 21/0332; H01L 21/03341;
(Continued)

(56) References Cited

U.S. PATENT DOCUMENTS 9,947,804 B1 * 4/2018 Frougier ......... H01L 21/823412
10,720,431 B1 * 7/2020 Cheng ................ H01L 21/3086
(Continued)

FOREIGN PATENT DOCUMENTS

CN   109755290 A   5/2019
CN   109755312 A   5/2019

OTHER PUBLICATIONS

PCT International Search Report and Written Opinion in PCT/US2020/033361 dated Sep. 9, 2020, 10 pages.

*Primary Examiner* — Younes Boulghassoul
(74) *Attorney, Agent, or Firm* — Servilla Whitney LLC

(57) ABSTRACT

Method of forming an electronic device with a bottom isolation dielectric between a pair of gate stacks is described. Each of the gate stacks comprises a plurality of gate layers. A sacrificial film having a liner on a top and side thereof is on top of the gate layers. A capping layer is on the top of the liner.

13 Claims, 3 Drawing Sheets

(51) Int. Cl.
  *H01L 21/285* (2006.01)
  *H01L 21/02* (2006.01)
  *H01L 21/3105* (2006.01)
  *H01L 29/423* (2006.01)
  *H01L 21/3213* (2006.01)
  *H01L 21/308* (2006.01)
  *H01L 21/033* (2006.01)
  *H01L 29/786* (2006.01)

(52) U.S. Cl.
  CPC .... *H01L 21/0337* (2013.01); *H01L 21/28568* (2013.01); *H01L 21/3083* (2013.01); *H01L 21/31051* (2013.01); *H01L 21/32133* (2013.01); *H01L 21/76205* (2013.01); *H01L 21/76224* (2013.01); *H01L 29/42392* (2013.01); *H01L 29/78696* (2013.01)

(58) Field of Classification Search
  CPC ............. H01L 21/0335; H01L 21/0337; H01L 21/0334; H01L 21/28247; H01L 21/76834; H01L 21/7685–76852
  See application file for complete search history.

(56) References Cited

U.S. PATENT DOCUMENTS

| | | |
|---|---|---|
| 2014/0225065 A1 | 8/2014 | Rachmady et al. |
| 2017/0170294 A1* | 6/2017 | Doris .................. H01L 29/7853 |
| 2017/0179248 A1 | 6/2017 | Pawlak |
| 2018/0261670 A1 | 9/2018 | Yeung et al. |
| 2019/0109040 A1* | 4/2019 | Chao .................. H01L 29/6681 |
| 2019/0305104 A1* | 10/2019 | Xie .................... H01L 21/02532 |
| 2020/0043742 A1* | 2/2020 | Chang ................ H01L 21/3085 |
| 2020/0083326 A1* | 3/2020 | Ok ........................ H01L 27/092 |
| 2020/0273753 A1* | 8/2020 | Loubet .............. H01L 21/02532 |
| 2020/0303500 A1* | 9/2020 | Lou ........................ H01L 29/785 |

\* cited by examiner

METHOD OF FORMING A BOTTOM ISOLATION DIELECTRIC BY DIRECTIONAL SPUTTERING OF A CAPPING LAYER OVER A PAIR OF STACKS

CROSS-REFERENCE TO RELATED APPLICATIONS

This application claims priority to U.S. Provisional Application No. 62/850,489, filed May 20, 2019, the entire disclosures of which is hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure are directed to methods of forming transistors using bottom isolation.

BACKGROUND

Generally, an integrated circuit (IC) refers to a set of electronic devices, e.g., transistors formed on a small chip of semiconductor material, typically, silicon. As the size of the IC decreases, isolation leakage current can increase due to weak electrostatic controllability under the bottom gate regions. Bottom isolation processes are used to mitigate the leakage current. However, current methods for bottom isolation generate integration defects caused by process damage.

Additionally, current methods are difficult to control the bottom gate for fin bottom isolation. The poor control results in an increase in risk of failure with gate length scaling of gate-all-around transistors.

Accordingly, there is a need in the art for methods of forming electronic devices with decreased leakage current.

SUMMARY

One or more embodiments of the disclosure are directed to methods of forming an electronic device. A bottom isolation dielectric is formed between a pair of gate stacks formed on a substrate. Each of the gate stacks comprises a plurality of gate layers, a sacrificial film is on top of the gate layers, the sacrificial film having a liner on a top and sides thereof, and a capping layer is on the top of the liner.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
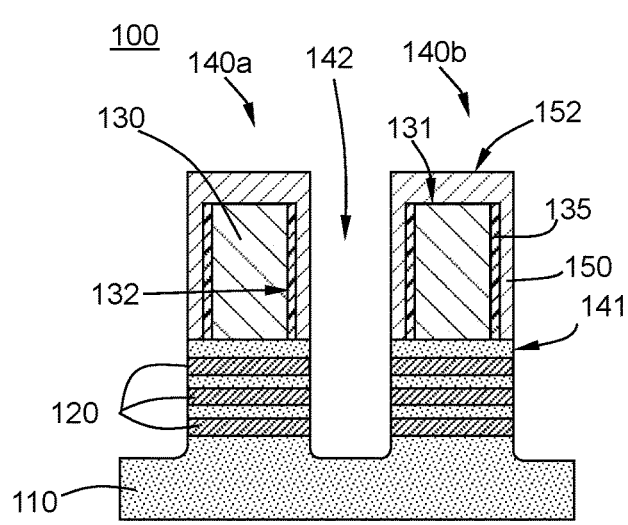
FIG. 1 illustrates a cross-sectional view of an electronic device structure according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in a least one embodiment of the present disclosure. Thus, the appearance of the phrases "in one embodiment" or "in an embodiment" in various places throughout the specification are not necessarily all referring to the same embodiment of the disclosure. Furthermore, the particular features, structures, or characteristics may be combined in any suitable manner in one or more embodiments.

One or more embodiments of the disclosure advantageously provide methods in which the gate top region can be protected when the bottom isolation dielectric is formed. Some embodiments of the disclosure advantageously provide methods for bottom isolation region definition without damage to the gates. Some embodiments of the disclosure advantageously provide methods for forming devices in which the bottom isolation dielectric and the inner spacer formation can be done in a single process. Some embodiments advantageously enhance the bottom isolation process window due to a protected gate top and spacer region.

With reference to the Figures, a method of forming an electronic device is described. FIG. 1 shows an initial electronic device comprising a substrate 110 which has been patterned to form a pair of gate stacks 140a, 140b. The substrate 110 had a plurality of alternating semiconductor layers (substrate 110) and gate layers 120. Patterning of the substrate 110 results in a device similar to the Figures with the alternating gate layers 120 separated by a gap 142 between the gate stacks 140a, 140b.

A sacrificial film 130 is on top of the gate layers 120. In the illustrated embodiment, the sacrificial film 130 is on one of the semiconductor layers over the gate layer 120. The sacrificial film 130 can be any suitable material deposited by any suitable technique.

An optional barrier layer 135 is on the substrate 110. The optional barrier layer 135 is on the sides of the sacrificial film 130 and can be deposited by any suitable technique known to the skilled artisan.

A liner 150 on a top 131 and sides 132 of the sacrificial film 130. The liner 150 can be any suitable material deposited by any suitable technique known to the skilled artisan.

Figure 2:
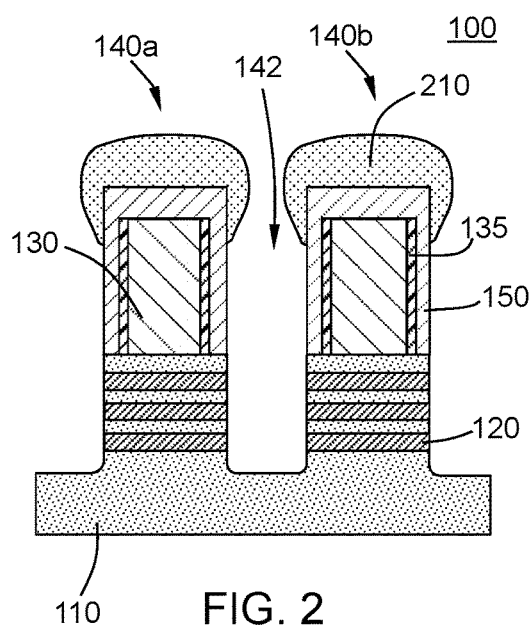
FIG. 2 illustrates a cross-sectional view of the electronic device structure of FIG. 1 after forming a capping layer according to one or more embodiments.

Referring to FIG. 2, a capping layer 210 is formed on the liner 150. The capping layer 210 is formed so that the capping material is substantially only on the top 152 of the liner 150. As used in this manner, the term "substantially only" means that the capping layer 210 is greater than or equal to about 80%, 85%, 90%, 95% or 98% on the top 152, on a weight basis. In some embodiments, a continuous capping layer 210 does not form below the top 20%, 10% or 5% of the height of the liner 150, measured from the top 152.

The capping layer 210 can be any suitable material deposited by any suitable technique. In some embodiments, the capping layer comprises one or more of titanium (Ti), titanium nitride (TiN) or silicon nitride (SiN).

In some embodiments, the capping layer 210 is deposited on the top of the liner 150 using a selective physical vapor deposition (SPVD) process. In some embodiments, the SPVD process comprises directionally sputtering capping layer 210 material from an angle to cover the top 152 of the liner 150 and substantially none of the sides of the liner. For example, the sputter target may be positioned at an angle to the substrate in the range of about 10° to about 80°, or in the range of about 20° to about 70°, or in the range of about 30° to about 60°, where 90° is perpendicular to the substrate surface.

Figure 3:
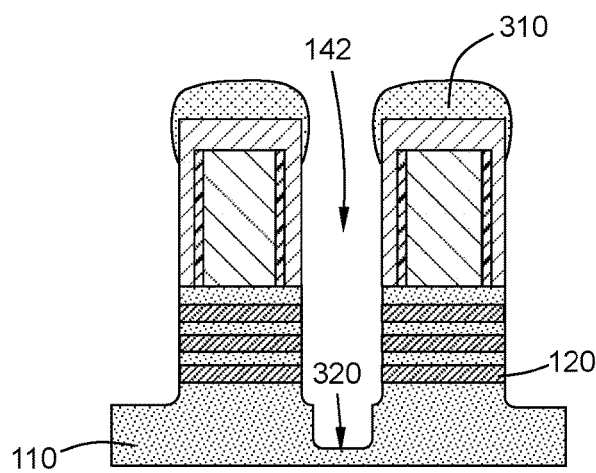
FIG. 3 illustrates a cross-sectional view of the electronic device structure of FIG. 2 after trimming the capping layer and forming an isolation trench according to one or more embodiments.
Figure 4:
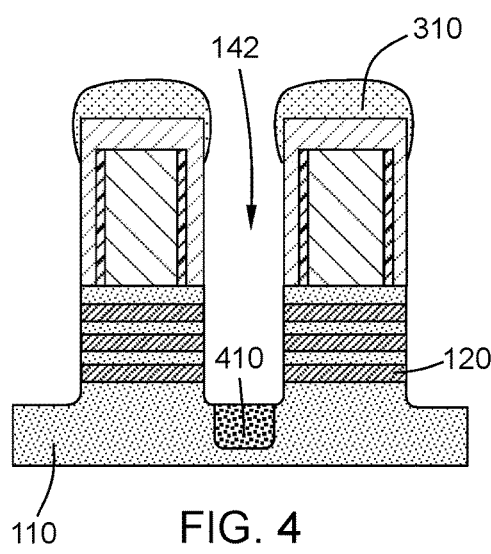
FIG. 4 illustrates a cross-sectional view of the electronic device structure of FIG. 3 after forming the bottom isolation dielectric according to one or more embodiments.

Referring to FIG. 3, an optional process creates an isolation trench 320 in the substrate 110 between the gate stacks 140a, 140b. The isolation trench 320 can be filled with a dielectric material to provide a bottom isolation dielectric 410, as shown in FIG. 4. In some embodiments, the optional process of FIG. 3 also trims the sides of the capping layer 210 to form the trimmed capping layer 310. The trimming and isolation trench 320 can occur in a single process at the same time, or can be separate processes in the same or different processing chambers. In some embodiments, the trimming process comprises an anisotropic etch process.

In some embodiments, forming the bottom isolation dielectric 410 between the gate stacks 140a, 140b comprises a deposition/etch process. A gapfill film can be deposited between the gate stacks 140a, 140b followed by an etchback process to lower the dielectric film to form the bottom isolation dielectric 410. The result of such a process is shown in FIG. 4.

In some embodiments, the trimming process illustrated in FIG. 3 is omitted and the bottom isolation dielectric 410 is formed by conversion of the substrate 110. For example, the substrate 110 material between the gate stacks can be oxidized by a directional oxidizing plasma to convert the substrate to the bottom isolation dielectric 410. In some embodiments, the substrate 110 comprises silicon and the bottom isolation dielectric 410 comprises silicon oxide.

Figure 5:
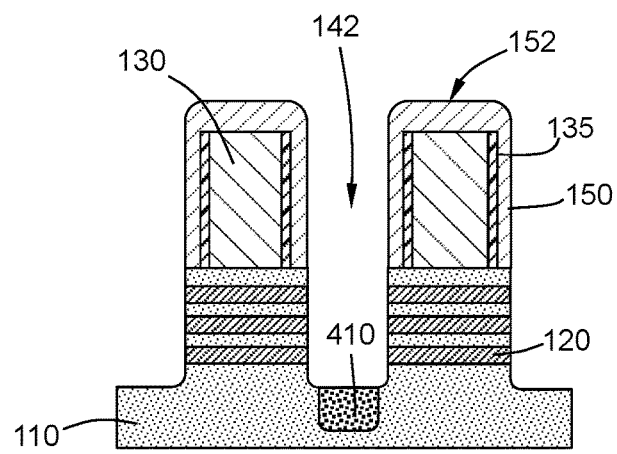
FIG. 5 illustrates a cross-sectional view of the electronic device structure of FIG. 4 after removing the capping layer according to one or more embodiments.

Referring to FIG. 5, the capping layer 210, or trimmed capping layer 310 (as shown in the Figures) is removed from the liner 150. Removal of the capping layer 310 can be done by any suitable technique known to the skilled artisan. In some embodiments, a stripping process to remove the capping layer 310 is selective to the capping layer material and does not damage or etch the substrate 110, liner 150 or bottom isolation dielectric 410.

Figure 6:
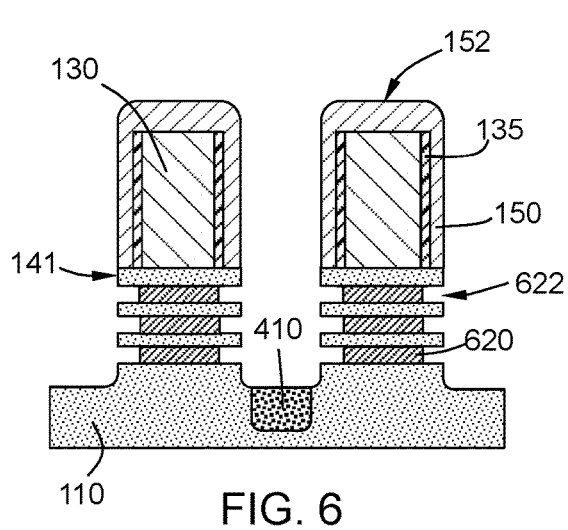
FIG. 6 illustrates a cross-sectional view of the electronic device structure of FIG. 5 after recessing the gate layers according to one or more embodiments.

Referring to FIG. 6, in some embodiments, the plurality of gate layers 120 are recessed from sides 141 of the gate stack 140a, 140b to form an opening 622 in the sides of the recessed gate layers 620.

Figure 7:
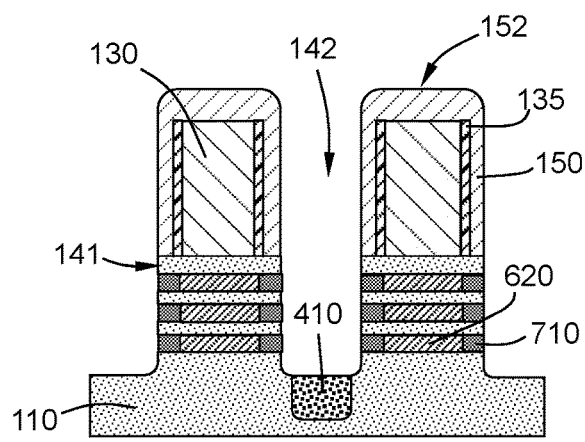
FIG. 7 illustrates a cross-sectional view of the electronic device structure of FIG. 6 after depositing a dielectric according to one or more embodiments.

In FIG. 7, a dielectric 710 is deposited in the openings 622 of the recessed gate layers 620. Deposition of the dielectric 710 can be by any suitable technique known to the skilled artisan. In some embodiments, a deposition/etch process is used perform a gapfill process, followed by anisotropic etching to remove the deposited material from the sides 141 of the gate stack 140a, 140b.

Figure 8:
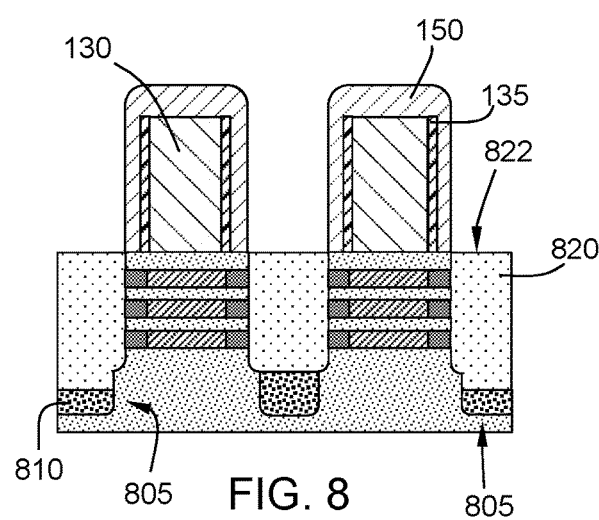
FIG. 8 illustrates a cross-sectional view of the electronic device structure of FIG. 7 (or FIG. 14) after forming the outside isolation dielectrics and depositing a semiconductor material according to one or more embodiments.

In FIG. 8, an outer isolation dielectric 810 is formed on a side of the gate stack 140a, 140b opposite the side 141 with the bottom isolation dielectric 410. The outer isolation dielectric 810 can be formed by converting the substrate 110 to the outer isolation dielectric 810 in a suitable process, e.g., oxidation. In some embodiments, the substrate 110 is recessed on the opposite side of the gate stack 140a, 140b to form an outer isolation trench 805. The outer isolation dielectric 810 can then be deposited in the outer isolation trench 805 by any suitable technique.

The embodiment illustrated in FIG. 8 also has a semiconductor material 820 deposited on the substrate 110. The semiconductor material 820 can be any suitable material, including but not limited to, silicon (Si) or silicon germanium (SiGe). The semiconductor material 820 can be deposited by any suitable technique known to the skilled artisan. The semiconductor material 820 is deposited so that the top 822 of the semiconductor material 820 is about level with the top of the substrate 110 at the interface with the liner 150.

Figure 9:
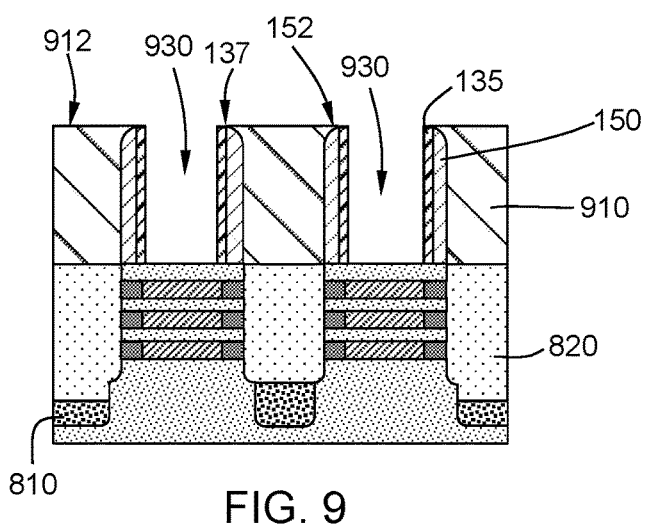
FIG. 9 illustrates a cross-sectional view of the electronic device structure of FIG. 8 after depositing a dielectric material and removing the sacrificial film according to one or more embodiments.

In FIG. 9, a dielectric 910 is shown deposited on the semiconductor material 820 to cover the top 152 of the liner 150. In the illustrate embodiment, the top 137 of the barrier layer 135 is also exposed. The dielectric 910 can be deposited by any suitable technique. In some embodiments, the dielectric 910 is deposited to form an overburden on the substrate to cover the top 152 of the liner 150 followed by planarization by any suitable technique to remove the top of the liner 150 to expose the sacrificial film 130.

After exposing the sacrificial film 130, the sacrificial film 130 can be removed and replaced with a different material. In some embodiments, removing the sacrificial film 130 comprises selectively etching the film. In some embodiments, the barrier layer 135 is removed with the sacrificial film 130. In some embodiments, the barrier layer 135 remains after removal of the sacrificial film 130.

Removing the sacrificial film 130 creates an opening 930 in the gate stacks 140a, 140b. In the illustrated embodiment, the sides of the opening 930 are covered with the barrier layer 135 and liner 150. In some embodiments, the sides of the opening 930 are covered by the liner 150.

Figure 10:
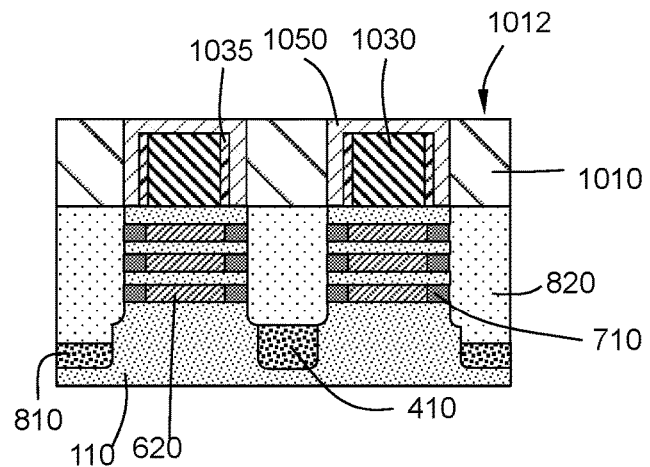
FIG. 10 illustrates a cross-sectional view of the electronic device structure of FIG. 9 after depositing a high-k metal gate according to one or more embodiments.

Referring to FIG. 10, in some embodiments, the sacrificial film 130 is replaced with a high-k metal gate 1030. Additional liner 1050 material is shown deposited on the high-k metal gate 1030.

Figure 11:
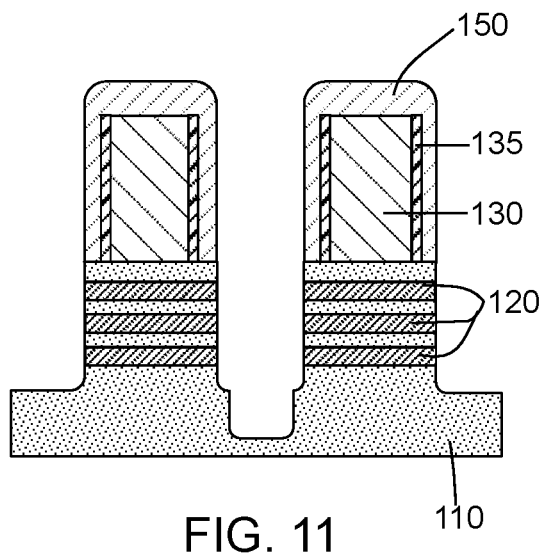
FIG. 11 illustrates a cross-sectional view of the electronic device structure of FIG. 3 after removing the capping layer according to one or more embodiments.

Referring to FIGS. 11 through 14, another embodiment of the disclosure is provided in which the gate layer 620 recessing and bottom isolation dielectric 410 deposition are reversed. FIG. 11 shows the electronic device of FIG. 3 after removing the capping layer 310 after formation of the isolation trench 320.

Figure 12:
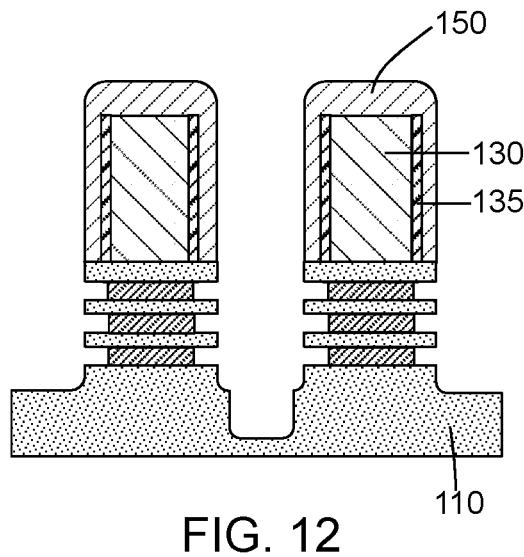
FIG. 12 illustrates a cross-sectional view of the electronic device structure of FIG. 11 after recessing the gate layers according to one or more embodiments.
Figure 13:
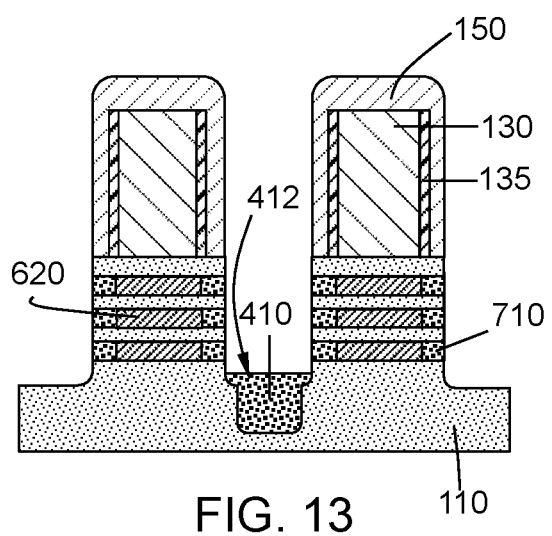
FIG. 13 illustrates a cross-sectional view of the electronic device structure of FIG. 12 after depositing a dielectric in the recessed gate layers and isolation trench according to one or more embodiments.

FIG. 12 shows the electronic device of FIG. 11 after recessing the gate layers 120 to form the recessed gate layers 620 leaving openings 622. FIG. 13 shows the electronic device of FIG. 12 after depositing a dielectric material in the openings 622 and the isolation trench 320. The dielectric 710 in the openings 622 and the bottom isolation dielectric 410 can be the same or different materials and can be deposited by any suitable technique.

Figure 14:
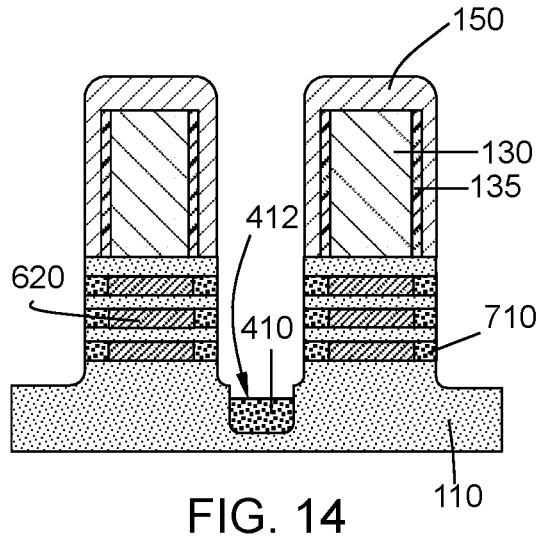
FIG. 14 illustrates a cross-sectional view of the electronic device structure of FIG. 13 after forming the bottom isolation dielectric according to one or more embodiments.

In some embodiments, as partially illustrated in FIGS. 13 to 14, the dielectric material is deposited in the gap between the gate stacks 140a, 140b to fill openings 622 and isolation trench 320. After gapfilling, the dielectric material can be removed to lower the top 412 of the dielectric material to be within or even with the isolation trench 320. The removal process can be any suitable technique(s) including, but not limited to, anisotropic etching. After depositing the dielectric material, the electronic device is equivalent to that illustrated in FIG. 7, and the process can follow the same path through FIGS. 8 to 10.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming an electronic device, the method comprising:
    forming a capping layer on a pair of stacks on a substrate, each stack comprising a plurality of alternating semiconductor layers and gate layers on the substrate, a sacrificial film on the plurality of alternating semiconductor layers and gate layers, and a liner on the sacrificial film, wherein the capping layer is formed by directionally sputtering, from an angle, a capping layer material on a top surface of the liner and substantially none on a side surface of the liner, the capping layer extending less than 20% of the height of the liner;
    trimming a side surface of the capping layer and forming an isolation trench between each of the pair of stacks; and
    forming a bottom isolation dielectric in the isolation trench.

2. The method of claim 1, wherein the capping layer comprises one or more of titanium (Ti), titanium nitride (TiN) or silicon nitride (SiN).

3. The method of claim 1, wherein the capping layer is formed on the top surface of the liner using a selective physical vapor deposition (SPVD) process.

4. The method of claim 1, wherein trimming the side surface of the capping layer comprises an anisotropic etch process.

5. The method of claim 1, wherein trimming the side surface of the capping layer and forming the isolation trench occurs at the same time.

6. The method of claim 1, wherein forming the bottom isolation dielectric comprises depositing a dielectric film in the isolation trench followed by an etchback process to recess the dielectric film.

7. The method of claim 1, wherein the pair of stacks further comprises a barrier layer on the sacrificial film.

8. A method of forming an electronic device, the method comprising:
    forming a capping layer on a pair of stacks on a substrate, each stack comprising a plurality of alternating semiconductor layers and gate layers on the substrate, a sacrificial film on the plurality of alternating semiconductor layers and gate layers, and a liner on the sacrificial film, wherein the capping layer is formed by directionally sputtering, from an angle, a capping layer material on a top surface of the liner and substantially none on a side surface of the liner, the capping layer extending less than 20% of the height of the liner;
    trimming a side surface of the capping layer; and
    forming a bottom isolation dielectric between each of the pair of stacks by converting a portion of the substrate between each of the pair of stacks into the bottom isolation dielectric.

9. The method of claim 8, wherein converting the portion of the substrate between the pair of stacks to the bottom isolation dielectric comprises exposing the substrate to a directional oxidizing plasma.

10. The method of claim 8, wherein the capping layer comprises one or more of titanium (Ti), titanium nitride (TiN) or silicon nitride (SiN).

11. The method of claim 8, wherein the capping layer is formed on the top surface of the liner using a selective physical vapor deposition (SPVD) process.

12. The method of claim 8, wherein trimming the side surface of the capping layer comprises an anisotropic etch process.

13. The method of claim 8, wherein the pair of stacks further comprises a barrier layer on the sacrificial film.

* * * * *